(12) United States Patent
Laisne et al.

(10) Patent No.: US 8,420,410 B2
(45) Date of Patent: Apr. 16, 2013

(54) TECHNIQUES PROVIDING FIDUCIAL MARKERS FOR FAILURE ANALYSIS

(75) Inventors: Michael Laisne, San Diego, CA (US);
Xiangdong Pan, San Diego, CA (US);
Foua Vang, San Diego, CA (US);
Prayag B. Patel, San Diego, CA (US);
Donald D. Lyons, San Diego, CA (US);
Martin Villafana, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 35 days.

(21) Appl. No.: 12/831,541

(22) Filed: Jul. 7, 2010

(65) Prior Publication Data

US 2011/0164808 A1  Jul. 7, 2011

Related U.S. Application Data

(60) Provisional application No. 61/224,017, filed on Jul. 8, 2009.

(51) Int. Cl.
*H01L 21/00* (2006.01)

(52) U.S. Cl.
USPC 438/7; 257/797; 257/E21.525; 257/E23.179; 257/E23.001

(58) Field of Classification Search .................. 257/797, 257/E21.525, E23.179, E23.001; 438/7
See application file for complete search history.

(56) References Cited

U.S. PATENT DOCUMENTS

| | | | |
|---|---|---|---|
| 5,214,299 A | 5/1993 | Gal et al. | |
| 6,672,947 B2 * | 1/2004 | Tsao et al. | 451/57 |
| 7,423,312 B1 | 9/2008 | Torii | |
| 2002/0011678 A1 * | 1/2002 | Templeton et al. | 257/797 |
| 2008/0135986 A1 | 6/2008 | Moon | |
| 2008/0299492 A1 * | 12/2008 | Kiuchi et al. | 430/311 |

FOREIGN PATENT DOCUMENTS

JP  7086366 A  3/1995

OTHER PUBLICATIONS

International Search Report and Written Opinion—PCT/US2010/041436, International Search Authority—European Patent Office—Apr. 8, 2011.

* cited by examiner

*Primary Examiner* — Thao Le
*Assistant Examiner* — Matthew Gordon
(74) *Attorney, Agent, or Firm* — Michelle Gallardo

(57) ABSTRACT

A semiconductor die includes a group of spacer cells within the semiconductor die. The spacer cells include fiducial markings therein. The fiducial markings can be located within a metal layer, a diffusion layer, a polysilicon layer, and/or a Shallow Trench Isolation (STI) structure.

24 Claims, 9 Drawing Sheets

TECHNIQUES PROVIDING FIDUCIAL MARKERS FOR FAILURE ANALYSIS

CROSS-REFERENCE TO RELATED APPLICATION

The present application claims the benefit of U.S. Provisional Patent Application No. 61/224,017, filed Jul. 8, 2009, and entitled "A UNIQUE SPACER CELL STRUCTURE FOR FAILURE ANALYSIS (FA) MARKER," the disclosure of which is expressly incorporated by reference herein in its entirety.

TECHNICAL FIELD

The present disclosure generally relates to semiconductor manufacturing. More specifically, the present disclosure relates to techniques providing fiducial markers in spacer cells of semiconductor dies.

BACKGROUND

Failure Analysis (FA) is a process performed to discern the causes of failures of semiconductor dies. Failure analysis can be performed while a die is still in the design phase or even after commercial quantities of a die have been produced and marketed.

One conventional failure analysis technique involves deprocessing a die, layer by layer, and visually inspecting the inside of the die, usually by microscope or other imaging device, to discover the cause of failure. When using high-magnification microscopy (e.g., during micro-probing), the field of view seen by a human operator is very small compared to the overall area of the die, and it is often time consuming for a human operator to determine which portion of the die is in the field of view.

One conventional solution is shown in FIG. 1. FIG. 1 is a top-down schematic illustration of a die layout 100. The die layout 100 includes a number of logic cells, such as a logic cell 101, which may include AND gates, NAND gates, OR gates and/or the like. The die layout 100 also includes fiducial markers, such as a fiducial marker 102, which indicates a position to a human user or computer. In other words, during failure analysis, a human user employing microscopy can use the fiducial markers as an indication of location within the die as well as for navigation from place to place within the die. Of note in die layout 100 is the regular pattern in which the fiducial markers are laid out. Such conventional approach places the fiducial markers before placing the cells. A disadvantage of such approach is that the placement of fiducial markers affects the placement of the cells, resulting in a less than optimal cell placement.

BRIEF SUMMARY

In one embodiment, a semiconductor die includes at least one spacer cell within the semiconductor die. The at least one spacer cell has at least one fiducial marker therein.

In another embodiment, a method for creating a semiconductor die includes making the semiconductor die with at least one spacer cell therein. The at least one spacer cell has at least one fiducial marker.

In one embodiment, a semiconductor die includes means, within spacer cells of the semiconductor die, for providing an indication of location.

In yet another embodiment, a method for performing failure analysis is disclosed. The method includes observing a semiconductor die under magnification and using at least one fiducial marker in a spacer cell of the semiconductor die for an indication of location.

In another embodiment, a method for creating a semiconductor die includes the step of making the semiconductor die with a plurality of spacer cells therein. The spacer cells include fiducial markers.

In yet another embodiment, a semiconductor die includes at least one fiducial marker using Shallow Trench Isolation within the semiconductor die.

The foregoing has outlined rather broadly the features and technical advantages of the present disclosure in order that the detailed description that follows may be better understood. Additional features and advantages will be described hereinafter which form the subject of the claims of the disclosure. It should be appreciated by those skilled in the art that the conception and specific embodiments disclosed may be readily utilized as a basis for modifying or designing other structures for carrying out the same purposes of the present disclosure. It should also be realized by those skilled in the art that such equivalent constructions do not depart from the technology of the disclosure as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 2:
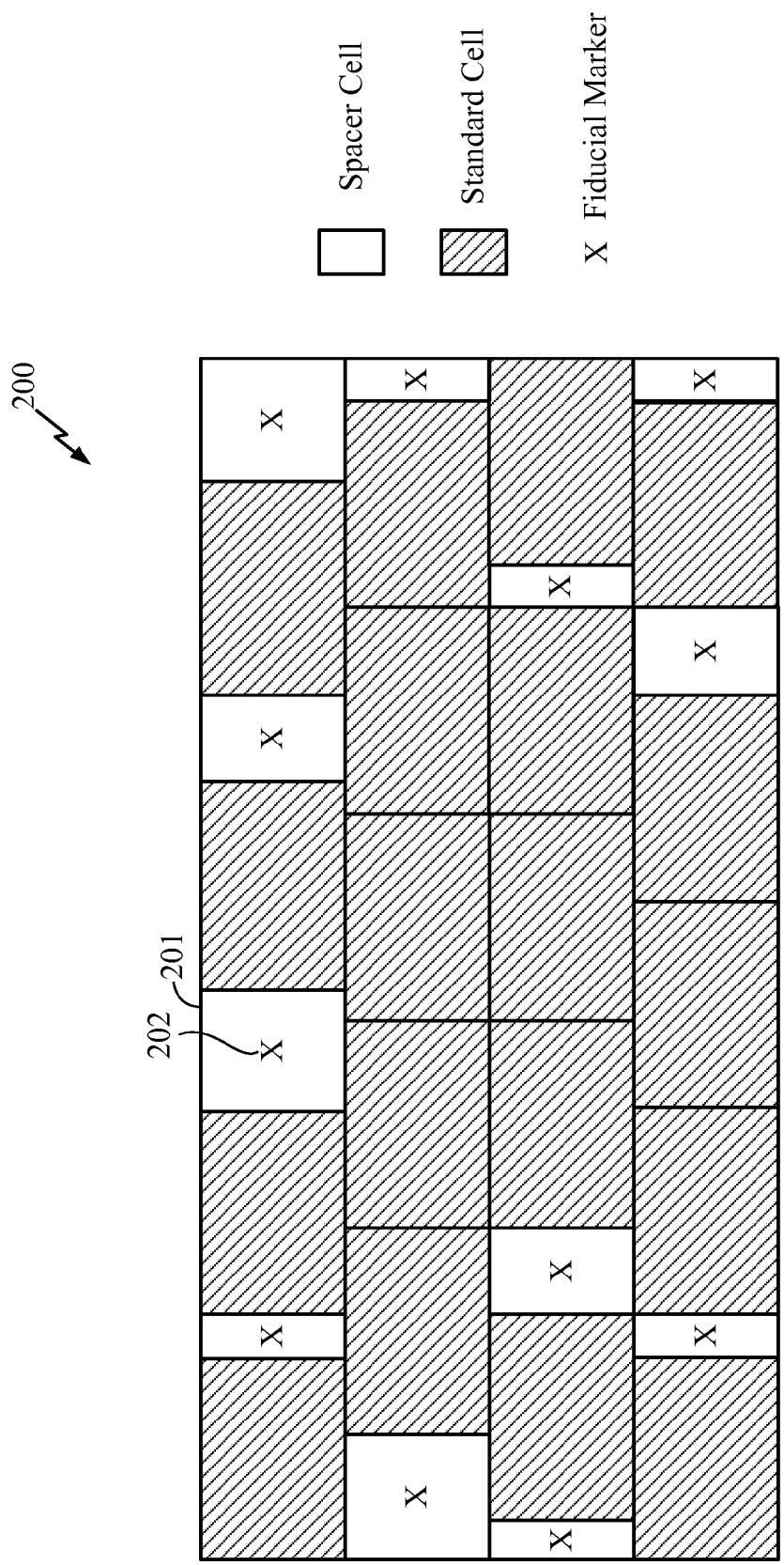
FIG. 2 is a top-down illustration of an exemplary cell layout adapted according to one embodiment.

FIG. 2 is a top-down illustration of an exemplary cell layout 200 adapted according to one embodiment. The cell layout 200 includes standard (or logic) cells as well as spacer cells, each denoted by shading. The spacer cells include fiducial markers, one example being a spacer cell 201, which includes a fiducial marker 202.

In one particular example, a human user of a layout tool designs a semiconductor die, for example, an Application Specific Integrated Circuit (ASIC). The human user employs a layout tool, which includes a library of logic cells and a computer program to place the logic cells as efficiently as possible so as to minimize the total area of the die. The tool uses a place and route process to place the logic cells, and the spaces between the logic cells are designated as spacer cells. The place and route process is a conventional technology, and various embodiments may use place and route processes or other processes now known or later developed to layout a design.

Spacer cells, while not usually including logic, do sometimes include metal layers, diffusion layers, polysilicon layers, and the like. In this example, the metal layers in the spacer cells connect to metal layers in logic cells to form continuous power and ground rails laterally across the die.

Figure 1:
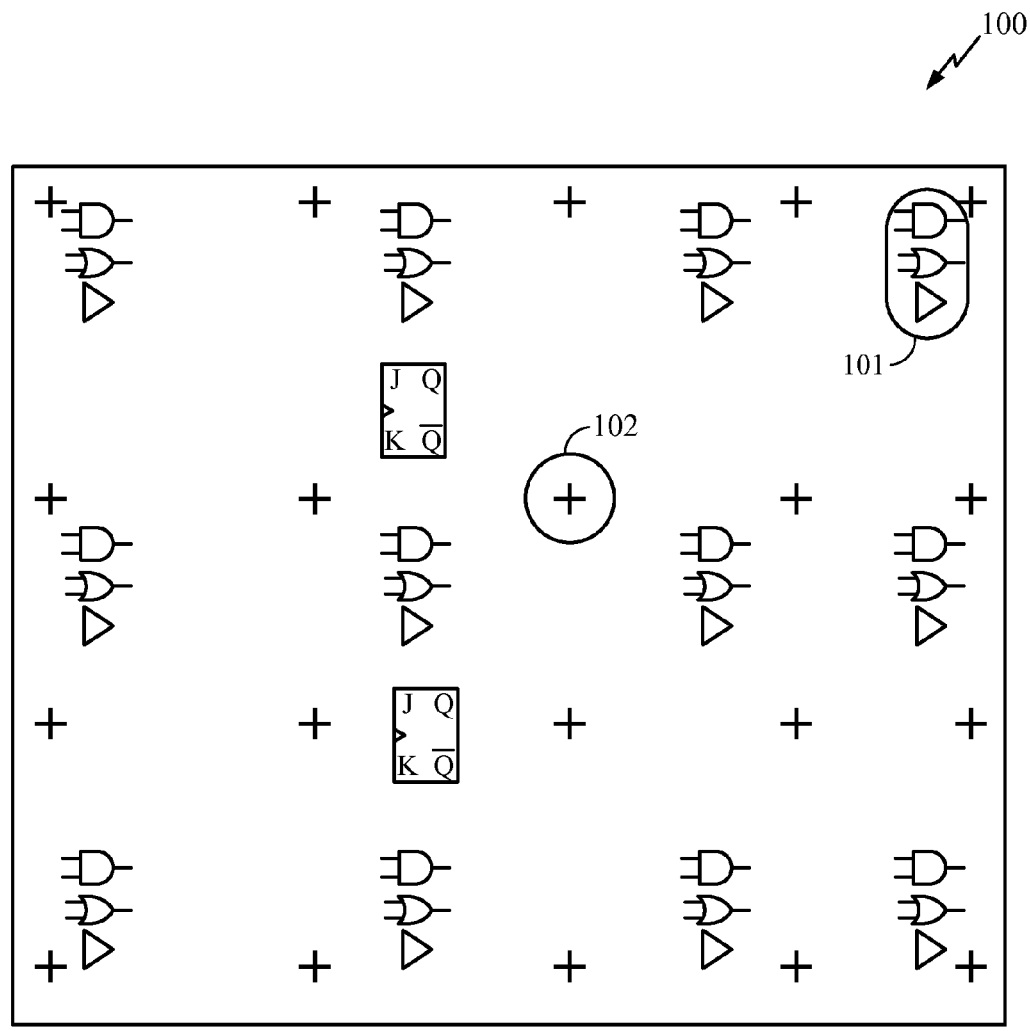
FIG. 1 is a top-down schematic illustration of a conventional die layout.

In this example embodiment, the layout 200 includes fiducial markers in the spacer cells, and the fiducial markers can be used for navigation and location within the die. Rather than conforming to a regular pattern, as in the conventional example of FIG. 1, the layout 200 includes fiducial markers that follow the pattern of the spacer cells, a pattern that is irregular because it is laid out for conservation of space and efficiency of routing with respect to the logic cells.

The fiducial markers, themselves, can include identifiable arrangements of structures within a metal layer, a polysilicon layer, a diffusion layer, or any other layer than may be present in the spacer cells. Fiducial markers may also include Shallow Trench Isolation (STI) structures that can be used for location and navigation within the die. Fiducial markers can be created using the same or similar techniques that now create metal layers, polysilicon layers, and diffusion layers. However, any technique now known or later developed for creating such layers can be used. STI structures can be formed when depositing a diffusion layer, especially in a scenario when there is no polysilicon gate between n+ and p+ structures in the diffusion layer. Examples of markers, including STI structures, are shown in detail with respect to FIGS. 3, 5, and 6.

The examples above show fiducial markers within spacer cells of a die. The scope of embodiments is not limited to the use of fiducial markers in spacer cells only, nor is the scope of embodiments limited to using all spacer cells for fiducial markers. For instance, in some embodiments, fiducial markers not in spacer cells (such as those of FIG. 1) may be used in addition to fiducial markers in spacer cells. Furthermore, in some embodiments, some spacer cells may not have fiducial markers.

Figure 3:
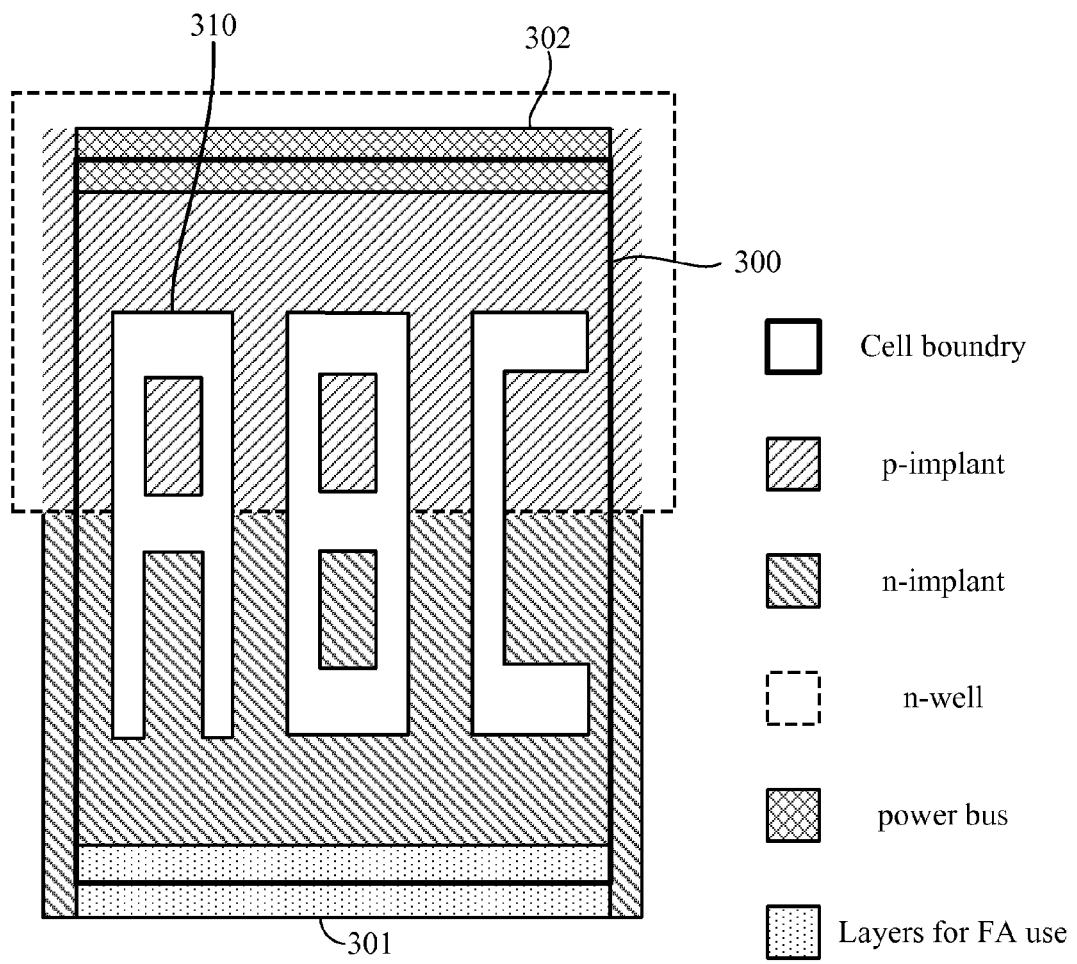
FIG. 3 is a top-down illustration of exemplary spacer cell adapted according to one embodiment.

FIG. 3 is a top-down illustration of exemplary spacer cell 300 adapted according to one embodiment. As indicated by the legend, the exemplary spacer cell 300 straddles a boundary between p-implant and n-implant structures. Power rails 301 and 302 are continuous with those of adjacent cells (not shown). The spacer cell 300 also includes a fiducial marker 310 in the form of three characters ("ABC") formed of the various layers. For instance, the fiducial marker 310 may include shapes formed by one or more of a diffusion layer, a polysilicon layer, a metal layer, and/or the like. In one example, the fiducial marker 310 exploits several layers so that it is visible even as layers are successively removed during deprocessing. In some examples, the same mark is created once for each layer so successive deprocessing uncovers the same marker.

Spacer cells can be distinguished using fiducial markers. In one example, spacer cells of a certain size share the same shape for fiducial markers. In another example, there are multiple different shapes for the same spacer cell size for the purpose of having more variability among the spacer cells. Furthermore, the fiducial marker 310 is only one example of a fiducial marker, as other markers can be used as well and may be adapted to the space available in a given spacer cell.

Figure 4:
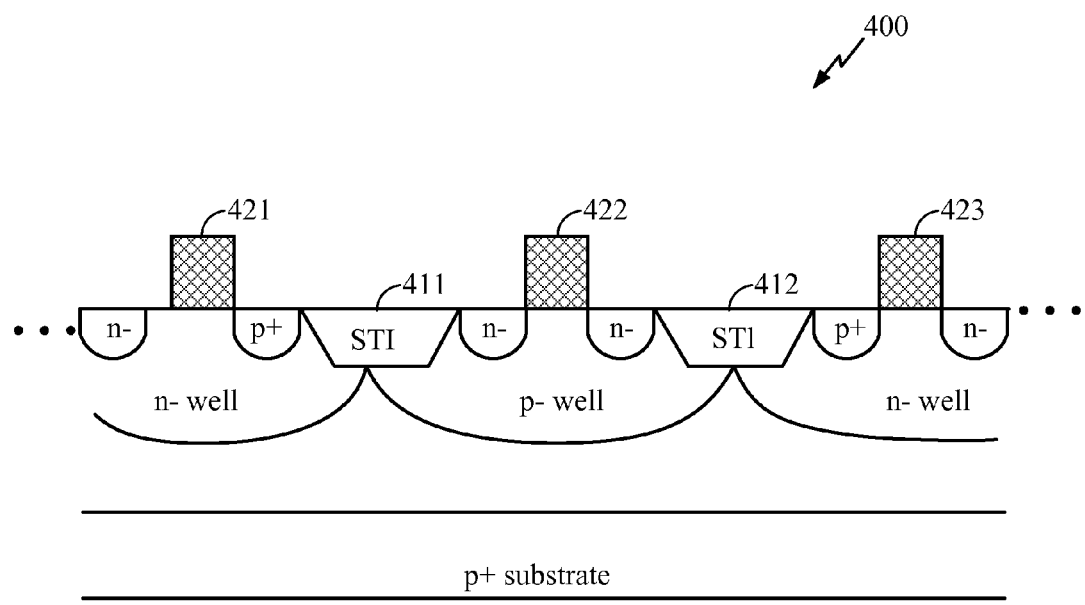
FIG. 4 is a cut-away illustration of an exemplary semiconductor die adapted according to one embodiment.

Additionally or alternatively to the character-type marking shown in FIG. 3, STI structures can be used as fiducial markers. FIG. 4 is a cut-away illustration of an exemplary semiconductor die 400 adapted according to one embodiment. The die 400 is not shown in its entirety in order to focus attention on the STI structures 411, 412. Rather, only a portion of the die 400 is shown, and it is understood that the die 400 may include other logic cells and spacer cells (not shown) on either side.

The three polysilicon structures 421, 422, 423 are each part of transistors in logic cells, whereas the two STI structures 411, 412 are part of spacer cells. Thus, FIG. 4 shows three transistor-like structures interleaved with two STI structures; various embodiments may have different arrangements. According to various embodiments, STI structures can be used as fiducial markers. In one example, STI structures, such as STI structures 411, 412 can be given arbitrary shapes that can assist in visual recognition and assist in discerning location. STIs can be uniquely shaped as fiducial markers by drawing different types of diffusion next to each other in different wells.

STIs can be especially useful as fiducial markers in some embodiments because STIs are usually the first exposed layer when opening up a flip-chip before the circuits are destroyed. In some examples, fiducial markers include STI shapes as well as shapes exploiting other layers so that fiducial markers are seen during micro-probing after the removal of the first layer and in additional, successive layers as well.

Figure 5:
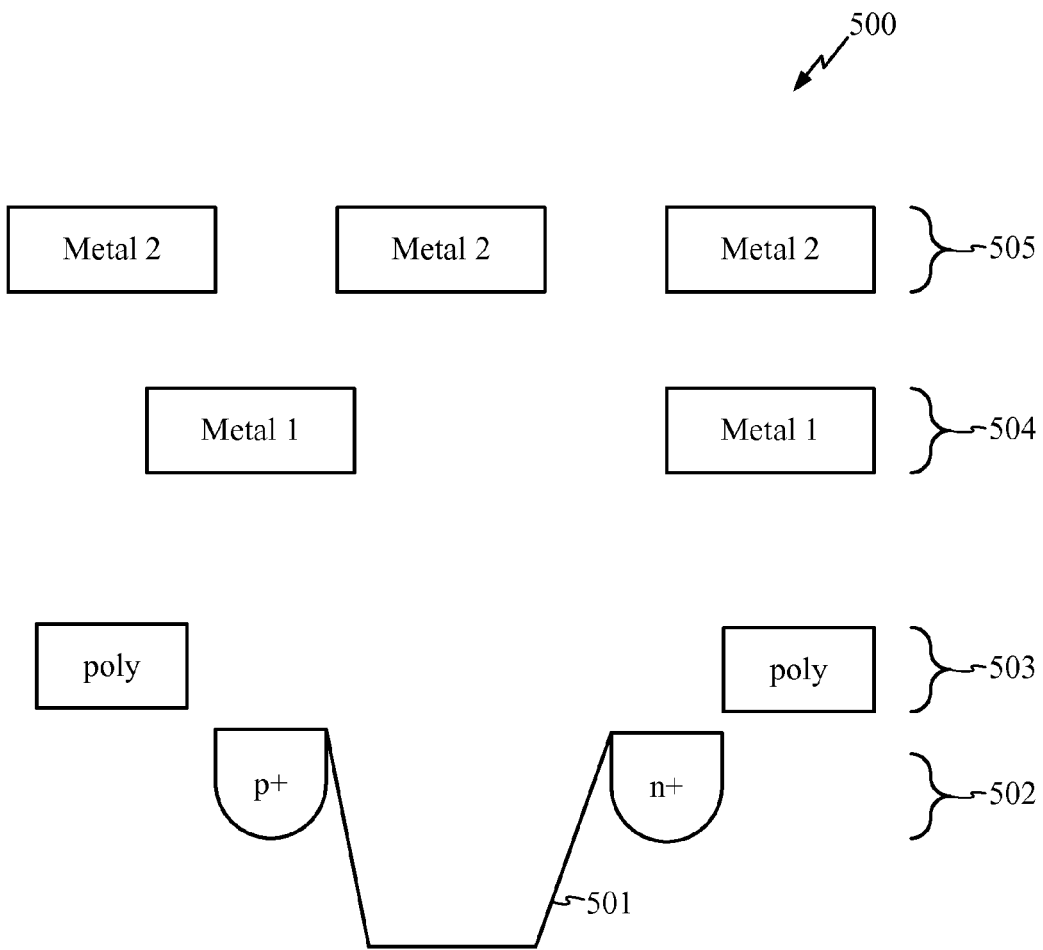
FIG. 5 is a cut-away illustration of a spacer cell adapted according to one embodiment.

FIG. 5 is a cut-away illustration of a spacer cell 500 adapted according to one embodiment. FIG. 5 is offered to show the layers of a single spacer cell 500, though it is understood that in various embodiments, the spacer cell 500 is adjacent to other cells (not shown). The spacer cell 500 includes an STI structure 501, which may be shaped so as to be used as a fiducial marker. The spacer cell 500 also includes a diffusion layer 502, a polysilicon layer 503, a first metal layer 504, and a second metal layer 505. Any one or more of the layers 502-505 may be shaped so as to form a fiducial marker. While FIG. 5 shows specific layers, the scope of embodiments is not so limited. For instance, various embodiments may add, omit, or rearrange some layers or include different types of layers.

Figure 6:
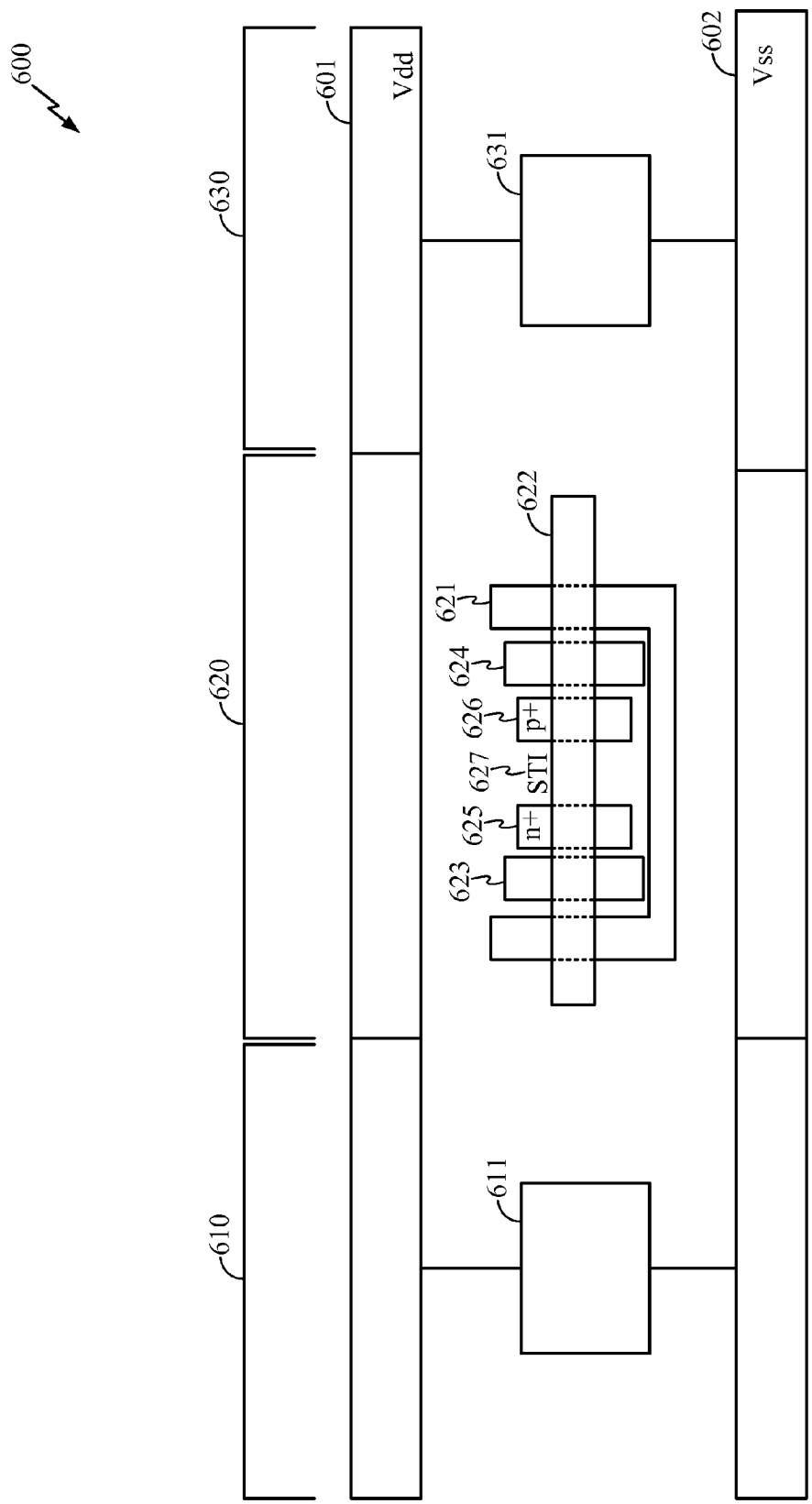
FIG. 6 is a top-down view of a portion of an exemplary semiconductor die adapted according to one embodiment.

FIG. 6 is a top-down view of a portion of an exemplary semiconductor die 600. FIG. 6 shows various layers exposed to illustrate at least one technique for forming a fiducial marker using layers of a spacer cell.

The portion of the semiconductor die 600 includes two logic cells 610, 630 separated by a spacer cell 620. Logic cells 610 and 630 include logic circuits 611 and 631, respectively, which may include AND gates, OR gates, NAND gates, and/or the like. The metal layers 601, 602 are used as power and ground buses, respectively.

From top to bottom: the two metal layers 621, 622 cross each other, the polysilicon layers 623, 624 are arranged in rows parallel with the diffusion layer structures 625, 626, and the STI 627 is in the center. In the spacer cell 620, the layers 621-627 create an arbitrary shape for location and navigation within the die.

Figure 7:
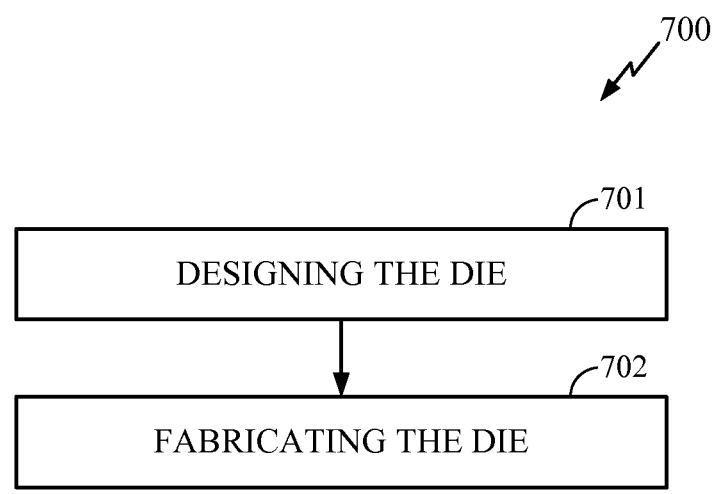
FIG. 7 is an illustration of exemplary process adapted according to one embodiment.

The scope of embodiments includes processes for making semiconductor dies that include fiducial markers, as shown above. FIG. 7 is an illustration of exemplary process 700 adapted according to one embodiment for making a semiconductor die that includes fiducial markers. In block 701, the die is designed, for example, by an engineer employing a computer design program. In this example, the engineer designs a die to provide particular functionality. The computer design program selects logic cells from a library for the layout of the die. The computer design program uses a place and route process to lay out the cells to minimize the size of the die and to provide efficient routing. The place and route process includes spacer cells within the die and spread among the logic cells so that the spacer cells have an irregular arrangement within the die.

In some embodiments, the spacer cells within the library include fiducial markers. Additionally or alternatively, in some embodiments, the fiducial markers are added after layout. The computer design program outputs a design that includes fiducial markers in the spacer cells.

In block 702, the die is fabricated. In many embodiments, the design from block 701 is used by a fabrication entity to manufacture the die. The die, itself, can be fabricated according to any of a variety of processes now known or later developed, including conventional die fabrication techniques, such as deposition, etching, and the like. Such fabrication processes can be used to make the various layers and/or STIs so that the layers and/or STIs have recognizable visual markers indicative of location in a die.

Various embodiments may add, omit, modify, or rearrange actions described above with respect to FIG. 7. For instance, some embodiments may include only designing processes, whereas other embodiments may include only fabricating processes. Furthermore, in some embodiments, the process continues by placing the die in a chip package and installing the chip package in a device, such as a music player, a video player, an entertainment unit, a navigation device, a communications device, a personal digital assistant (PDA), a fixed location data unit, or a computer. In another aspect, some embodiments include performing failure analysis and using the fiducial markers for location and navigation during the failure analysis, e.g., during micro-probing.

Various embodiments include advantages over conventional techniques. For instance, some conventional techniques pre-place fiducial markers before placing the cells of the die. In such conventional techniques, some logic cells are placed to avoid fiducial markers, rather than to increase efficiency. By contrast, in various embodiments of the disclosure, placement of the fiducial markers is determined by placement of the cells in a place and route process. Thus, various embodiments conserve space and routing resources when compared to some conventional techniques.

Additionally, some prior art markers are only placed in the top metal layers of dies, which is disadvantageous for use in flip-chip dies because flip chip dies are deprocessed from the backside so that the top metal layers are usually encountered very late in deprocessing. By contrast, some embodiments of the disclosure place fiducial markers in the active layers so that the fiducial markers are encountered, and can be used, early in deprocessing.

Figure 8:
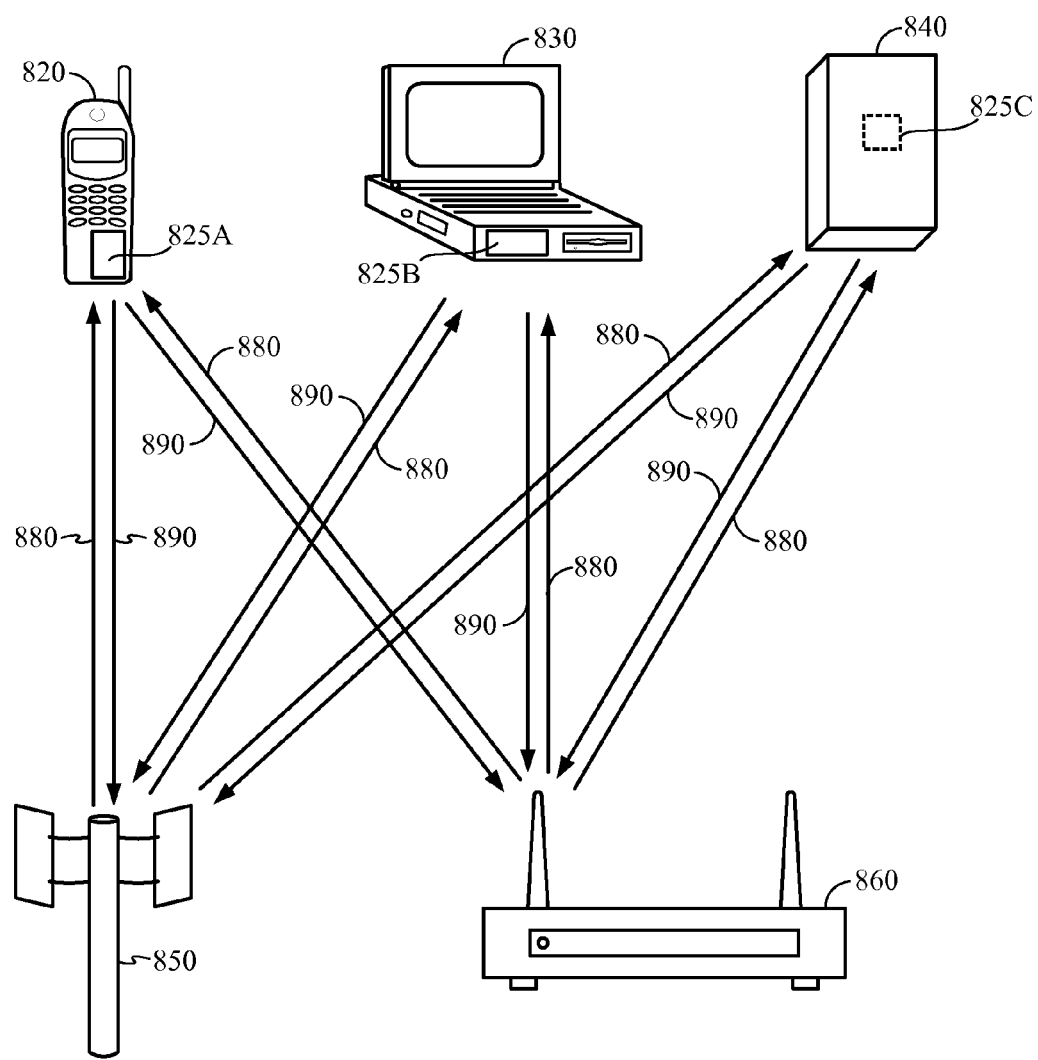
FIG. 8 is a block diagram illustrating a design workstation for circuit layout and wafer and die design of a semiconductor part as disclosed below.

FIG. 8 shows an exemplary wireless communication system 800 in which an embodiment of the disclosure may be advantageously employed. For purposes of illustration, FIG. 8 shows three remote units 820, 830, and 840 and two base stations 850, 860. It will be recognized that wireless communication systems may have many more remote units and base stations. The remote units 820, 830, and 840 include improved semiconductor devices 825A, 825B, and 825C, respectively, which in various embodiments include fiducial markers, as discussed above. Similarly, base stations 850 and 860 may include improved semiconductor devices which in various embodiments include fiducial markers. FIG. 8 shows the forward link signals 880 from the base stations 850, 860 and the remote units 820, 830, and 840 and the reverse link signals 890 from the remote units 820, 830, and 840 to base stations 850, 860.

In FIG. 8, the remote unit 820 is shown as a mobile telephone, the remote unit 830 is shown as a portable computer, and the remote unit 840 is shown as a computer in a wireless local loop system. For example, the remote unit 820 may include mobile devices, such as cell phones, hand-held personal communication systems (PCS) units, portable data units such as personal data assistants. The remote unit 820 may also include fixed location data units such as meter reading equipment. Although FIG. 8 illustrates remote units according to the teachings of the disclosure, the disclosure is not limited to these exemplary illustrated units. The disclosure may be suitably employed in any device which includes a semiconductor die. Although specific circuitry has been set forth, it will be appreciated by those skilled in the art that not all of the disclosed circuitry is required to practice the disclosure. Moreover, certain well known circuits have not been described in order to maintain focus on the disclosure.

Figure 9:
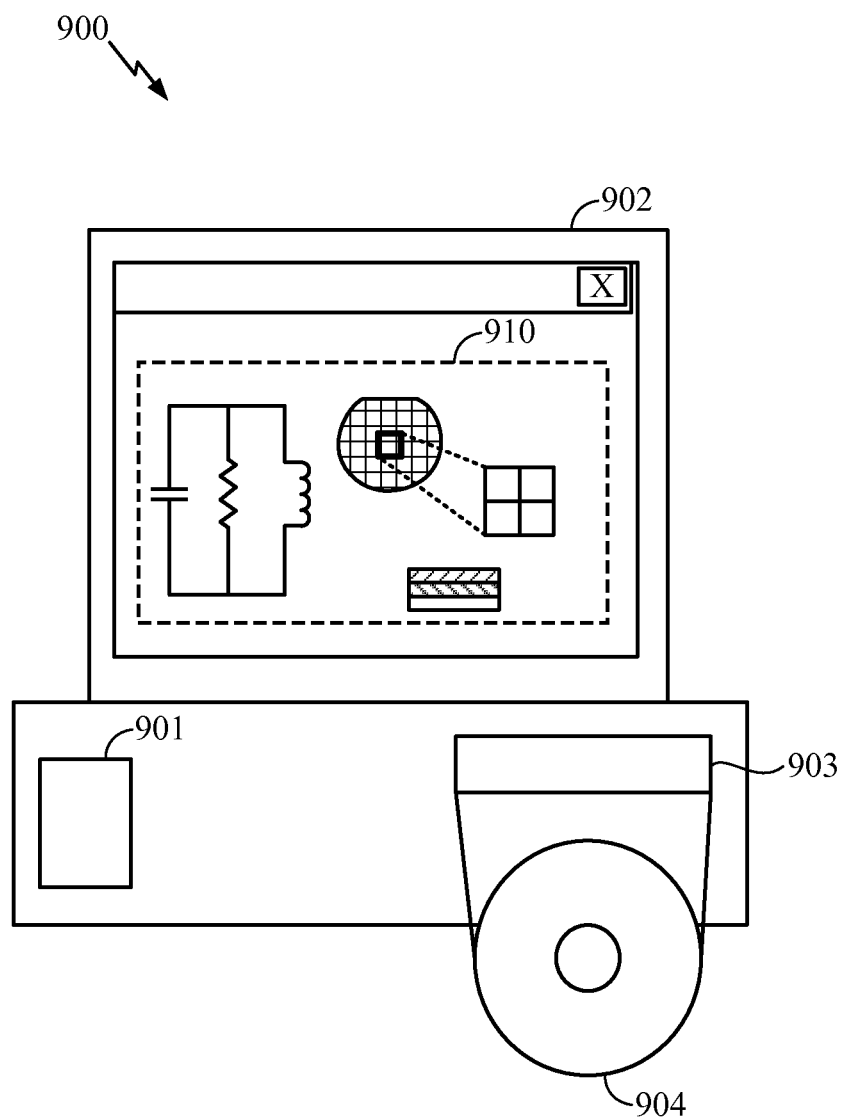
FIG. 9 shows an exemplary wireless communication system in which an embodiment of the disclosure may be advantageously employed.

FIG. 9 is a block diagram illustrating a design workstation for circuit layout and wafer and die design of a semiconductor part, such as the dies described above. A design workstation 900 includes a hard disk 901 containing operating system software, support files, and design software such as Cadence or OrCAD. The design workstation 900 also includes a display to facilitate design of a semiconductor part 910 that may include a semiconductor wafer, and/or a semiconductor die. A storage medium 904 is provided for tangibly storing the design of the semiconductor part 910. The design of the semiconductor part 910 may be stored on the storage medium 904 in a file format such as GDSII or GERBER. The storage medium 904 may be a CD-ROM, DVD, hard disk, flash memory, or other appropriate device. Furthermore, the design workstation 900 includes a drive apparatus 903 for accepting input from or writing output to the storage medium 904.

Data recorded on the storage medium 904 may specify configurations, pattern data for photolithography masks, or mask pattern data for serial write tools such as electron beam lithography. Providing data on the storage medium 904 facilitates the design of the semiconductor part 910 by decreasing the number of processes for manufacturing and/or designing semiconductor wafers and/or semiconductor dies.

The methodologies described herein may be implemented by various components depending upon the application. For example, these methodologies may be implemented in hardware, firmware, software, or any combination thereof. For a hardware implementation, the processing units may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, or a combination thereof.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to any type of long term, short term, volatile, nonvolatile, or other memory and is not to be limited to any particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer; disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor die comprising:
    a plurality of spacer cells arranged irregularly within the semiconductor die, at least one of the spacer cells including a plurality of layers;
    at least one fiducial marker comprising an identifiable arrangement of structures within a plurality of different spacer cell layers; and
    a plurality of logic cells arranged among the plurality of spacer cells, in which at least one conductive layer in the at least one spacer cell is coupled to at least one conductive layer in at least one of the logic cells to provide power and ground rails.

2. The semiconductor die of claim 1, in which the at least one fiducial marker is included in a metal layer, a via layer, a diffusion layer, a polysilicon layer, a contact layer, a well layer, and/or a Shallow Trench Isolation (STI) structure.

3. The semiconductor die of claim 1, in which the at least one fiducial marker is included in more than one of a metal layer, a via layer, a diffusion layer, a polysilicon layer, a contact layer, a well layer, and a Shallow Trench Isolation (STI) structure.

4. The semiconductor die of claim 1 in which the at least one fiducial marker comprises a Shallow Trench Isolation (STI) structure.

5. The semiconductor die of claim 1 included in a music player, a video player, an entertainment unit, a navigation device, a communications device, a personal digital assistant (PDA), a fixed location data unit, a base station, and/or a computer.

6. A method for creating a semiconductor die comprising:
    making the semiconductor die with a plurality of spacer cells arranged irregularly therein, at least one of the spacer cells including a plurality of layers;
    disposing at least one fiducial marker comprising an identifiable arrangement of structures within a plurality of different spacer cell layers;
    disposing a plurality of logic cells among the plurality of spacer cells, and
    coupling at least one conductive layer in the at least one spacer cell to at least one conductive layer in at least one of the logic cells to provide power and ground rails.

7. The method of claim 6 in which making the semiconductor die comprises:
    fabricating the semiconductor die.

8. The method of claim 6 in which making the semiconductor die comprises:
    designing the semiconductor die using a route and place process that determines placement of the at least one spacer cell within the semiconductor die.

9. The method of claim 8 in which the route and place process comprises:
    optimizing a placement of the at least one spacer cell and at least one logic cell to reduce a size of the semiconductor die.

10. The method of claim 6 in which making the semiconductor die comprises:
    disposing the at least one fiducial marker in a metal layer, a via layer, a diffusion layer, a contact layer, a well layer, a polysilicon layer, and/or a Shallow Trench Isolation (STI) structure.

11. The method of claim 6 in which making the semiconductor die comprises:
    disposing the at least one fiducial marker in more than one of a metal layer, a via layer, a diffusion layer, a polysilicon layer, a contact layer, a well layer, and a Shallow Trench Isolation (STI) structure.

12. The method of claim 6 in which the fiducial markers comprise Shallow Trench Isolation (STI) structures.

13. A semiconductor die comprising:
    means, within spacer cells of the semiconductor die, for providing an indication of location, the spacer cells including a plurality of layers, the location providing means within a plurality of different spacer cell layers, the spacer cells arranged irregularly within the die; and
    a plurality of logic cells arranged among the spacer cells, in which at least one conductive layer in at least one of the spacer cells is coupled to at least one conductive layer in at least one of the logic cells to provide power and ground rails.

14. The semiconductor die of claim 13, in which the means for providing an indication of location comprise arrangements of at least one structure in a metal layer, a via, layer, a diffusion layer, a contact layer, a well layer, a polysilicon layer, and/or a Shallow Trench Isolation (STI) structure.

15. The semiconductor die of claim 13, in which the means for providing an indication of location comprise arrangements of at least one structure in more than one of a via layer, a contact layer, a well layer, a metal layer, a diffusion layer, a polysilicon layer, and a Shallow Trench Isolation (STI) structure.

16. The semiconductor die of claim 13, in which the means for providing an indication of location comprise Shallow Trench Isolation (STI) structures.

17. The semiconductor die of claim 13 included in a music player, a video player, an entertainment unit, a navigation device, a communications device, a personal digital assistant (PDA), a fixed location data unit, a base station, and/or a computer.

18. A semiconductor die comprising:
   a plurality of fiducial markers using Shallow Trench Isolation within the semiconductor die, the plurality of fiducial markers arranged irregularly within a plurality of spacer cells including a plurality of layers within the die; and
   a plurality of logic cells arranged among the plurality of fiducial markers, in which at least one conductive layer in at least one of the spacer cells is coupled to at least one conductive layer in at least one of the logic cells to provide power and ground rails.

19. The semiconductor die of claim 18, in which the at least one fiducial marker is included in a metal layer, a via layer, a diffusion layer, a polysilicon layer, a contact layer, and/or a well layer.

20. The semiconductor die of claim 18, in which the at least one fiducial marker is included in more than one of a metal layer, a via layer, a diffusion layer, a polysilicon layer, a contact layer, and a well layer.

21. The semiconductor die of claim 18 included in a music player, a video player, an entertainment unit, a navigation device, a communications device, a personal digital assistant (PDA), a fixed location data unit, a base station, and/or a computer.

22. The method of claim 6, further comprising integrating the semiconductor die into a music player, a video player, an entertainment unit, a navigation device, a communications device, a personal digital assistant (PDA), a fixed location data unit, a base station, and/or a computer.

23. A semiconductor die comprising:
   means for providing an indication of location within the semiconductor die, the location providing means arranged irregularly within a plurality of spacer cells including a plurality of layers within the die; and
   a plurality of logic cells arranged among the location providing means, in which at least one conductive layer in at least one of the spacer cells is coupled to at least one conductive layer in at least one of the logic cells to provide power and ground rails.

24. The semiconductor die of claim 23 included in a music player, a video player, an entertainment unit, a navigation device, a communications device, a personal digital assistant (PDA), a fixed location data unit, a base station, and/or a computer.

* * * * *